United States Patent
Holm et al.

(10) Patent No.: US 12,078,465 B2
(45) Date of Patent: Sep. 3, 2024

(54) PIEZOELECTRIC SENSOR ARRANGEMENT AND A METHOD OF DISCRIMINATING SIGNALS

(71) Applicant: SAAB AB, Linköping (SE)

(72) Inventors: Tony Holm, Degerfors (SE); Johan Östlund, Örebro (SE)

(73) Assignee: SAAB AB, Linköping (SE)

( * ) Notice: Subject to any disclaimer, the term of this patent is extended or adjusted under 35 U.S.C. 154(b) by 1021 days.

(21) Appl. No.: 16/982,374

(22) PCT Filed: Mar. 15, 2019

(86) PCT No.: PCT/SE2019/050231
§ 371 (c)(1),
(2) Date: Sep. 18, 2020

(87) PCT Pub. No.: WO2019/182495
PCT Pub. Date: Sep. 26, 2019

(65) Prior Publication Data
US 2021/0003376 A1   Jan. 7, 2021

(30) Foreign Application Priority Data
Mar. 19, 2018   (SE) .................................. 1800060-4

(51) Int. Cl.
*H01L 41/113*   (2006.01)
*F42C 11/02*   (2006.01)
(Continued)

(52) U.S. Cl.
CPC .............. *F42C 11/02* (2013.01); *F42C 15/40* (2013.01); *H10N 30/302* (2023.02)

(58) Field of Classification Search
CPC ......................... H01L 41/1132; H10N 30/302
(Continued)

(56) References Cited

U.S. PATENT DOCUMENTS 3,256,817 A * 6/1966 Rabinow ................. F42C 11/02
102/210
3,622,814 A   11/1971 Carlson
(Continued)

FOREIGN PATENT DOCUMENTS

JP   H05-322497 A   12/1993
JP   2004-087526 A   3/2004
(Continued)

OTHER PUBLICATIONS

Extended European Search Report mailed Oct. 25, 2021 for European Application No. 19770321.8, 9 pages.
(Continued)

*Primary Examiner* — Derek J Rosenau
(74) *Attorney, Agent, or Firm* — Sage Patent Group

(57) ABSTRACT

A piezoelectric sensor arrangement for use in a projectile comprises a piezoelectric sensor enveloped by a damping layer adapted to attenuate signals of frequencies above a predetermined cutoff frequency whereby the voltage output signal of the piezoelectric sensor upon impact on a desired hard target can be discriminated from voltage output signals originating from impact on undesired soft objects. A method of discriminating voltage outlet signals by means of the piezoelectric sensor arrangement and the use of a piezoelectric sensor arrangement in a projectile to safeguard unintentional detonation does not occur is described herein.

8 Claims, 4 Drawing Sheets

(51) Int. Cl.
    *F42C 15/40*     (2006.01)
    *H10N 30/30*     (2023.01)

(58) Field of Classification Search
    USPC .......................................................... 310/339
    See application file for complete search history.

(56) References Cited

U.S. PATENT DOCUMENTS

| | | |
|---|---|---|
| 3,667,393 A | 6/1972 | Aronsson et al. |
| 5,033,382 A | 7/1991 | Webb |
| 5,157,220 A | 10/1992 | Schaffhauser et al. |
| 8,091,478 B1 | 1/2012 | Khuc et al. |
| 2007/0204756 A1* | 9/2007 | Rastegar ................. F42C 11/02 |
| | | 102/210 |
| 2015/0040787 A1 | 2/2015 | Radojevic et al. |
| 2017/0133954 A1 | 5/2017 | Rastegar |
| 2019/0129018 A1* | 5/2019 | Osawa .................... G01S 7/521 |

FOREIGN PATENT DOCUMENTS

| | | |
|---|---|---|
| SE | 413432 B | 5/1980 |
| WO | 03051794 A2 | 6/2003 |
| WO | 2003051794 A2 | 6/2003 |

OTHER PUBLICATIONS

International Search Report and Written Opinion in corresponding International Application No. PCT/SE2019/050231 dated May 15, 2019 (11 pages).
Office Action mailed Dec. 9, 2022 for Japanese Patent Application No. 2020-544536, 15 pages (inlcudes English translation).

\* cited by examiner

PIEZOELECTRIC SENSOR ARRANGEMENT AND A METHOD OF DISCRIMINATING SIGNALS

CROSS-REFERENCE TO RELATED APPLICATIONS

This application is a U.S. National Stage application of PCT/SE2019/050231, filed Mar. 15, 2019 and published on Sep. 26, 2019 as WO 2019/182495, which claims the benefit of Swedish Patent Application No. 1800060-4, filed Mar. 19, 2018, all of which are hereby incorporated by reference in their entireties.

The present invention relates to a piezoelectric sensor arrangement and a method of discriminating electrical output signals resulting from soft and hard targets. The invention also relates to the use of the piezoelectric sensor arrangement in a detonating projectile, e.g. a shell, safeguarding detonation does not occur unintentionally.

BACKGROUND OF THE INVENTION

It is commonly known that an electrical output signal is generated in a piezoelectric crystal integrated in a fuze in a detonating device, such as a shell, upon impact on a target. The electrical signal generated by the piezoelectric crystal is related to a shockwave generated in the shell and the deceleration which occurs on impact of the projectile on the target. The electrical signal is usually subjected to signal processing. The crystal is electrically connected to a fuze typically comprising a logic circuit determining whether the explosive comprised in the detonating device shall detonate or not. The fuze may thus initiate detonation of the munition's explosive material under specified conditions, e.g. when the electrical signal has reached a predetermined value. Piezoelectric crystals are known from e.g. WO 03/051794 disclosing an impact sensor in a warhead wherein a multi-mode fuze with at least one piezoelectric crystal generates an electrical output signal upon impact of a target. The device of WO03/051794 is able to discriminate electric signals transmitted upon impact on soft objects and hard targets respectively. By detecting and discriminating the signals, it is thus possible to control by means of the logic circuit when detonation shall occur, i.e. at what point in time detonation shall occur following impact on a soft or hard target.

Piezoelectric sensors have over time been developed to become more sensitive. This has implied that the sensors at times are overly sensitive. One example of this phenomenon is electrical voltage output signals with substantial peaks arising even for brushwood or other soft objects the projectile may pass on its way to the desired target. It has been found such peaks may even be higher than signals following impacts on hard targets with a small angle of impact, e.g. a few degrees. This implies a threshold for a minimum output voltage may not always be relied upon to discriminate disturbing objects such as brushwood or shrubbery (soft objects) from desired hard targets. It goes without saying that a risk for unintentional detonation may exist if an explosive or warhead detonates at an undesired location which may even result in considerable danger. One way of handling this problem is disclosed in U.S. Pat. No. 3,667,393 where premature detonation caused by tree branches is prevented by means of an air gap such that initiation of the fuze does not take place unless the air gap is short-circuited only when striking the target.

However, the problem to safely set a threshold when an explosive or warhead is to detonate still exists in the prior art since the fuze logic must be able to interpret the signals transmitted to it by the piezoelectric sensor in such way that detonation is initiated at the desired target. In particular, there is a problem in the art to discriminate impact on hard targets from a small angle of impact from e.g. brushwood. A further problem related to many piezoelectric sensors used nowadays is that conventional signal processing of the output voltage signals from the sensors may not always be sufficient to discriminate impacts on desired targets from impacts on undesired targets due to small differences in energy and limitations in time and space.

In view of the above, the present invention intends to provide a piezoelectric sensor arrangement capable of solving the above-mentioned problems. More particularly, the present invention intends to provide a piezoelectric sensor arrangement which provides for safe discrimination of output signals originating from desired objects from output signals originating from undesired objects such as brush wood. The invention also intends to provide a method that enables setting of a threshold for safe detonation at the desired target involving a new method of discriminating signals.

THE INVENTION

The present invention relates to a piezoelectric sensor arrangement for use in a projectile comprising a piezoelectric sensor fully or partially enveloped by a damping layer adapted to attenuate signals of frequencies above a predetermined cutoff frequency whereby the voltage output signal of the piezoelectric sensor upon impact on a desired hard target can be discriminated from voltage output signals originating from impact on undesired soft objects.

According to one embodiment, the invention relates to a piezoelectric sensor arrangement for use in a projectile, for example in a conventional shell, comprising a piezoelectric sensor fully or partially enveloped by a damping layer adapted to attenuate signals of frequencies above a predetermined cutoff frequency whereby the voltage output signal of the piezoelectric sensor upon impact on a desired hard target can be discriminated from voltage output signals originating from impact on undesired soft objects by
  i) integrating the voltage output signals obtained from the piezoelectric sensor upon impact over time to calculate the electrical energy
  ii) setting a threshold limit based on knowledge of the calculated electrical energies obtained in step i) thus safeguarding discrimination of low-energy content originating from undesired soft objects below said threshold limit from high-energy content originating from desired hard targets.

According to one embodiment, the damping layer allows signals below the predetermined cutoff frequency to pass, for example frequencies below about 800 Hz such as below about 500 Hz. According to one embodiment, the piezoelectric sensor is fully enveloped by a damping layer.

According to one embodiment, the damping layer is arranged to one side or both sides of a piezoelectric sensor. Such piezoelectric sensor preferably has a flat shape, for example shaped as a disc or coin, especially with a rounded shape having a front and back side. For example, if the sensor being fully enveloped by a damping layer has the shape of a cylinder such as a disc or coin, both its flat ends as well as the enveloping surface are covered by the damping layer.

The invention also relates to a method of discriminating voltage outlet signals by means of the piezoelectric sensor arrangement as described herein comprising
i) integrating the voltage output signals obtained from the piezoelectric sensor upon impact over time to calculate the electrical energy
ii) setting a threshold limit based on knowledge of the calculated electrical energies obtained in step i) thus safeguarding discrimination of low-energy content originating from undesired soft objects below said threshold limit from high-energy content originating from desired hard targets.

The invention also relates to the use of a piezoelectric sensor arrangement in a projectile, preferably in a shell, to safeguard unintentional detonation does not occur. The invention also relates to a projectile, preferably a shell, equipped with a sensor arrangement as described herein.

It has been found that the piezoelectric impulse in a piezoelectric sensor at different angles of impact may differ considerably. As an example, according to simulations referred to in the below, the impulse, i.e. the output voltage signal from a piezoelectric sensor, of a shell at an angle of impact of 5° may be as low as about 3% of the corresponding impulse of a perpendicular impact of the same shell. At an angle of impact of about 30°, the impulse may be about 35% of the impulse with perpendicular impact.

According to one embodiment, the damping layer has a thickness ranging from 0.01 to 2 mm, preferably from about 0.01 to 1 mm. According to one embodiment, the damping layer thickness ranges from 0.01 to 0.5 mm, for example from 0.01 to 0.1 mm.

According to one embodiment, the damping layer has a density ranging from 0.5 to 10, for example from 0.5 to 5, most preferably from 1 to 2.5 g/cm$^3$.

According to one embodiment, the damping layer has a durometer hardness, in the temperature range from −40 to 63° C., ranging from 20 to 100, preferably from 50 to 90, or most preferably from 60 to 80 Shore A (ISO 7619). According to one embodiment, the damping layer has a tensile strength ranging from 0.5 to 5, for example 1 to 3 MPa (ISO 37).

According to one embodiment, the damping layer has an elongation at break ranging from 80 to 95, preferably from 85 to 95% (ISO 37).

According to one embodiment, the damping layer has a tear strength ranging from 5 to 15, for example from 8 to 12 N/mm (ISO 34-IC).

According to one embodiment, the damping layer has a compression modulus ranging from 5 to 15, preferably from 8 to 12, most preferably from 9 to 11 MPa at 10% and 20% strain respectively (ISO 7743).

The thickness can be designed in accordance with the type of damping material, sensitivity of the piezoelectric sensor utilized, and type of detonating device etc. in order to safely detect and discriminate relevant output voltage signals from the piezoelectric material from signals originating from e.g. brushwood or other soft objects. In general, the thicker the damping layer, the larger is the damping effect and the reduction in electrical output signal, at least up to a certain level. Also, in general, the thicker the damping layer, the broader is the cut-off of frequencies of the signals. Whereas it is desired to cut-off disturbing signals from brushwood or other type of soft targets generating disturbing signals, signals from impacts on desired hard targets should not be cut-off since this may jeopardize correct setting of the fuze resulting in unintentional detonation due to insufficiently precise signal data to be processed.

Preferably, the "hard target" has a hardness higher than about 100 HB, for example higher than about 300 HB or higher than 500 HB. According to one embodiment, the hardness of the hard target is in the range from 100 to 1500, preferably from 200 to 1000 such as from 300 to 800 HB. The term "hard target" in the context of this invention means the deceleration of the projectile is at least 20%, preferably at least 50% or at least 99%. Preferably, the speed of the projectile is reduced by at least 20%, preferably at least 50% or at least at least 99% from the point in time the projectile impact on the target. As opposed to "hard target", the reduction in speed when impacting or passing a soft target such as brushwood is less than 20%.

Preferably, the damping material has substantially the same mechanical properties within the temperature range at which the damping material is exposed to, typically ranging from −80 to 80° C. According to one embodiment, the material of the damping layer does not substantially change its mechanical properties within a temperature ranging from −60 to 80° C.

According to one embodiment, the damping layer is attached to the piezoelectric sensor, e.g. by means of clamping means, gluing, soldering or by dispensing a damping layer, preferably by attaching the damping layer directly on the piezoelectric sensor or on the structure comprising the piezoelectric sensor. Preferably, the damping layer is intimately joined to the piezoelectric sensor without any play or space in between, preferably by means of gluing or soldering.

According to one embodiment, the damping layer (5) is composed of silicone or a silicone-based material. By the term "silicone" as used herein is meant any polysiloxane compound including polymers that include any inert, synthetic compound made up of repeating units of siloxane, which is a chain of alternating silicon and oxygen atoms, frequently combined with carbon and/or hydrogen. Polysiloxane is more precisely known as polymerized siloxanes and consist of an inorganic silicon-oxygen backbone chain with organic side groups attached to the silicon atoms. These silicon atoms are tetravalent. Silicones are polymers constructed from inorganic-organic monomers. Silicones have in general the chemical formula $[R_2SiO]_n$, where R is an organic group such as an alkyl (methyl, ethyl) or phenyl group.

In some cases, organic side groups can be used to link two or more of these —Si—O— backbones together. By varying the —Si—O— chain lengths, side groups, and crosslinking, silicones can be synthesized with a wide variety of properties and compositions. They can vary in consistency from liquid to gel to rubber to hard plastic. The most common siloxane is linear polydimethylsiloxane (PDMS), a silicone oil. The second largest group of silicone materials is based on silicone resins, which are formed by branched and cage-like oligosiloxanes.

Preferably a piezoelectric crystal is used. Piezoelectric crystals emit current when mechanical power is applied. Conversely, they are mechanically deformed by an applied electrical current.

The interrelationship between mechanical power and electrical current is usually utilized in the sensor application of the present invention. Conventionally, the piezoelectric sensor initiates detonation of an explosive material upon impact on target. A shock wave will on impacting the target propagate through the shell body (or other device) and reach the surface of the piezoelectric sensor. The piezoelectric sensor can then convert the mechanical shock wave to an electrical pulse or signal. An electrical unit, typically a logic circuit, will process the shape of the electrical pulse and decide whether the shell shall detonate or not. The logical circuit determines electrical properties of the electrical pulse such as the rise time and the amplitude of the electrical pulse.

According to one embodiment, a delay circuit is comprised to delay detonation after impact. Delay and ignition circuits may be provided and adapted to different munitions and operations.

According to one embodiment, the piezoelectric sensor or crystal is cut into two or several pieces, e.g. three pieces, preferably two pieces to enable sensing of bending forces i.e. forces occurring when the warhead is striking against the target from a different angle of impact than perpendicular.

Preferably, the piezoelectric sensor provided with the damping layer is arranged adjacent the fuze, e.g. electronic components of the fuze. Preferably, the piezoelectric sensor with damping layer is attached to the fuze or arranged in the fuze structure, e.g. in the vicinity of electronic components of the fuze. The attachment may be performed by soldering or glueing of the sensor to the fuze structure.

Preferably, the piezoelectric sensor is mounted in a fuze, for example by means of springs. Mounting by means of springs may be preferable since safety and arming units may move when the projectile with the sensor impacts on a target. Also, static loads occasioned by for example tolerances and variations in temperature may be minimized. The cutoff frequency is decided by the thickness and material type of the damping layer and how the damping layer is arranged to the piezoelectric sensor and how the piezoelectric sensor is arranged in the projectile.

WORKING EXAMPLE

Simulations were made using a round hitting a steel surface at different angles at a speed of 200 m/s. A Sonox P52 was used as piezoelectric crystal with a damping layer of silicone having a thickness of 0.8 mm. The simulations (tests) were performed according to the following:

Bump test: STANAG 4370, AECTP 300 (Edition 3), Method 403, Procedure 3, figure A-1

Drop test: STANAG 4370, AECTP 300 (Edition 3), Method 414, Procedure 1

Vibration test: STANAG 4370, AECTP 400 (Edition 3), Method 401, Procedure 3, figure B-1.

Brush wood no-fire test: MIL-STD 331. The standard test was performed to verify that the round can be fired through brushes between the weapon and the target.

DETAILED DESCRIPTION OF THE INVENTION

Figure 1:
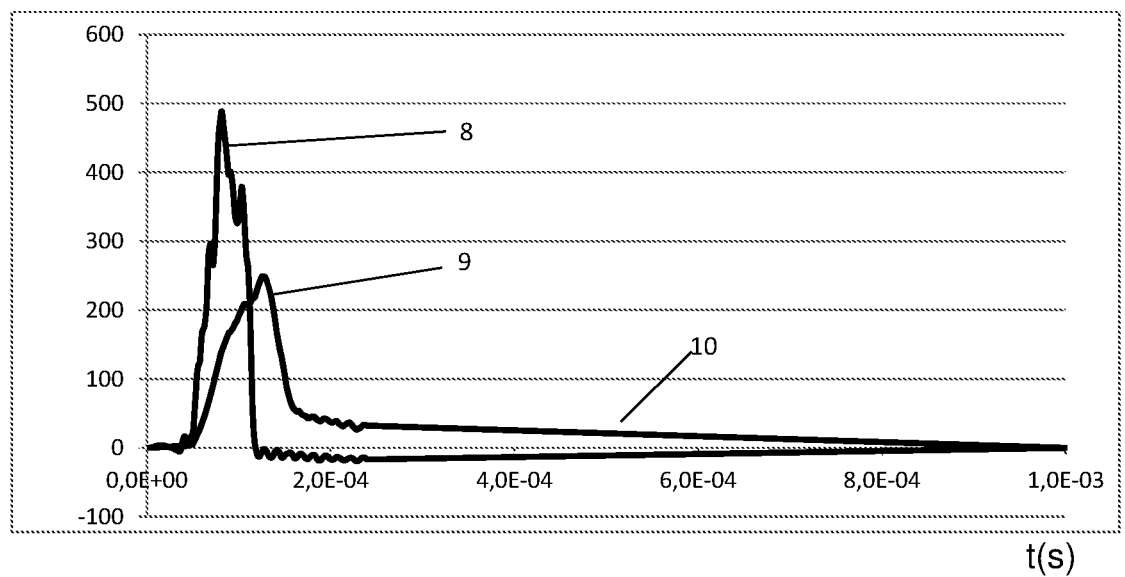
FIG. 1 shows electric output voltage signals of a piezoelectric crystal without a damping layer.

FIG. 1 shows simulated raw data of piezoelectric voltages for various target types. The X-axis shows time (in seconds) and the Y-axis shows voltage (in Volts). It may be noted that voltages start to arise after a period of time of about 0.05 ms. At that time, a shock wave is sensed by the piezoelectric crystal (without damping layer) via the mechanical structure of the shell impacting on a target. From a mechanical movement in the piezoelectric sensor, an electric current is output from the piezoelectric sensor. The electrical current charges a capacitor and other electrical components arranged to be charged by an electrical current. The capacitor is electrically connected to the logical device and/or processor device of the electronics of the fuze. The signals from the piezoelectric sensor are thus transmitted to the processor of the fuze that analyzes the signals. The signal is analysed with respect to time and amplitude including rise time, amplitude and integration of the voltage over time. Integration of the voltage over time corresponds to the generated electrical energy increasing over time. As the projectile impacts on brushwood, the electrical energy is declining after an initial increase in generated electrical energy. As can be noted in FIG. 1, impact on brushwood 8 creates a short but high peak in the piezoelectric crystal whereas impact on a steel target 9 at an angle of 5° results in a signal of lower amplitude of the peak but also a signal reflecting the retardation of the projectile over time. Numeral 10 indicates the deceleration upon impact on the steel target 8.

Figure 2:
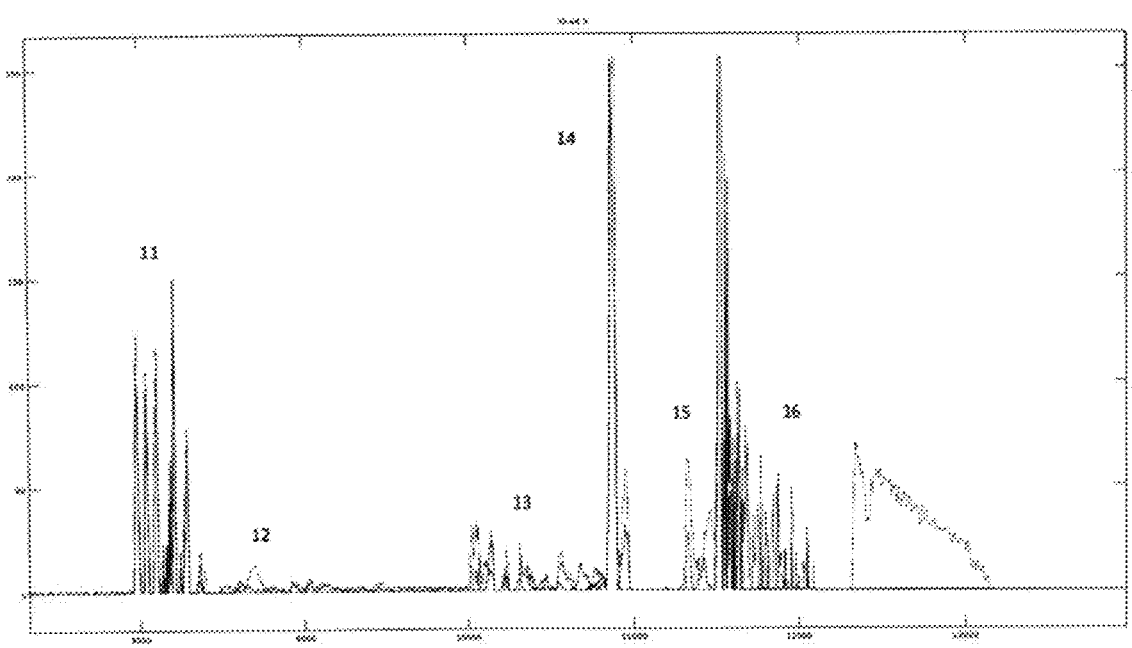
FIG. 2 shows electric output voltage signals of a piezoelectric crystal embedded in a damping layer of silicone.

FIG. 2 shows simulated data of piezoelectric voltage signals impacting on brushwood and a steel target at an angle of 5°. The piezoelectric crystal is embedded in a damping layer of silicone with a thickness of 0.8 mm. The Y-axis corresponds to the digital reference value the analogue-digital converter (ADC) yields. 0 corresponds to 0 V and 255 corresponds to the reference value of the ADC (in this particular case, 2.3 V). The different numerals represent the following impacts:

Brushwood 11 (the signals of which have been considerably reduced relative to impact on the steel target 14). The signals of the silicone-embedded piezoelectric crystal is to be compared to the non-embedded piezoelectric signals in FIG. 1 where the signals of the brushwood have higher peaks than the signals following impact on the steel target. Signals 12 represent freely flying shell which not yet has reached the steel target. The signals 13 represent the impact of the fins of the shell on the steel target (impact angle 5°). The peak 14 represents impact on the steel target by the shell body. The signal 15 represents the shell having rebounded and flying freely toward a sand heap (represented by signal 16) where the shell stops. FIG. 2 clearly shows the filtering effect of the silicone layer resulting in considerably reduced signals, in particular following passage through the brushwood.

Figure 3:
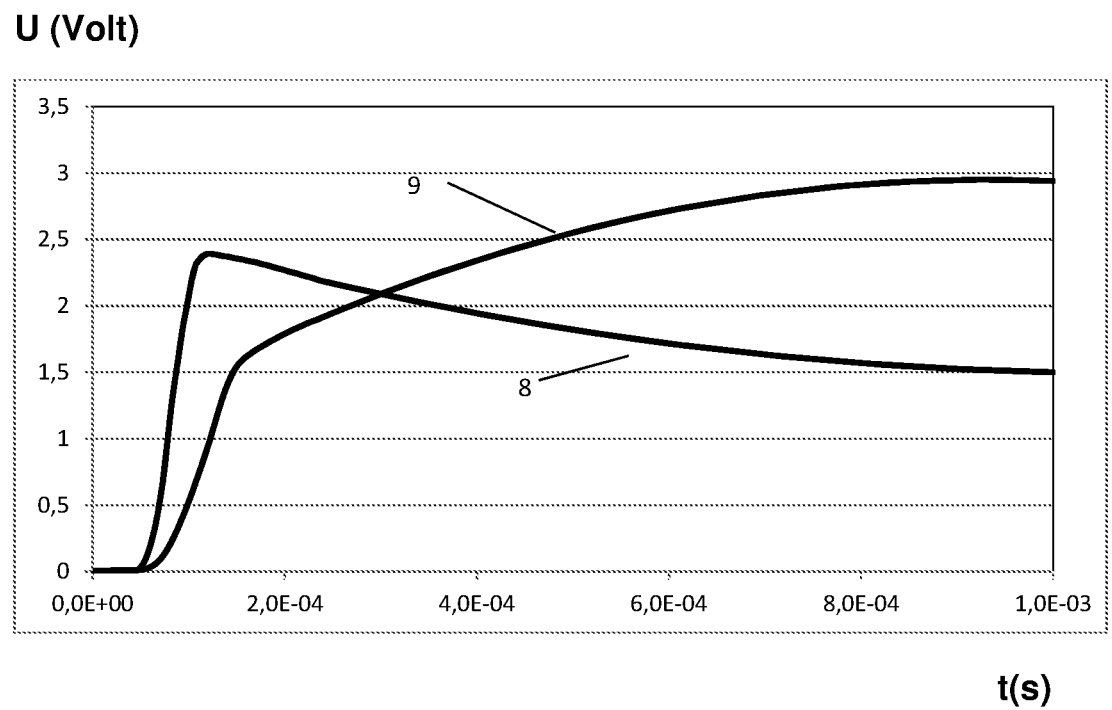
FIG. 3 shows electric output voltage signals having been integrated over time with respect to an arrangement in which the piezoelectric crystal is embedded in a damping layer of silicone.

FIG. 3 shows simulated data of integrated piezoelectric voltages. The same piezoelectric crystal as in FIG. 1 is used but in FIG. 3, it is provided with a silicone damping layer attached around the surface of the piezoelectric crystal. The piezoelectric signals illustrated in FIG. 3 have been filtered, i.e. frequencies above a certain level have been cut-off by means of the silicone layer and integrated. Also, the graphs of FIG. 3 illustrating the retardation following the impact on the steel target at an impact angle of 5° have been integrated over time. The input signals have been transmitted to the fuze electronics having a predetermined threshold triggering whether the projectile shall detonate or not. In FIG. 3, as the signals have been integrated, the signal of the desired target can be discriminated from the brushwood, i.e. the undesired object. This method of integrating signals over time thus enables safe setting of a threshold voltage signal when a detonation shall occur without running the risk of premature detonation, for example as the shell passes brushwood. The threshold set will determine at which minimum level the detonation shall be initiated. The threshold voltage for one and the same damped piezoelectric crystal will vary depending on the mechanical structure of the device, e.g. a shell.

Figure 4:
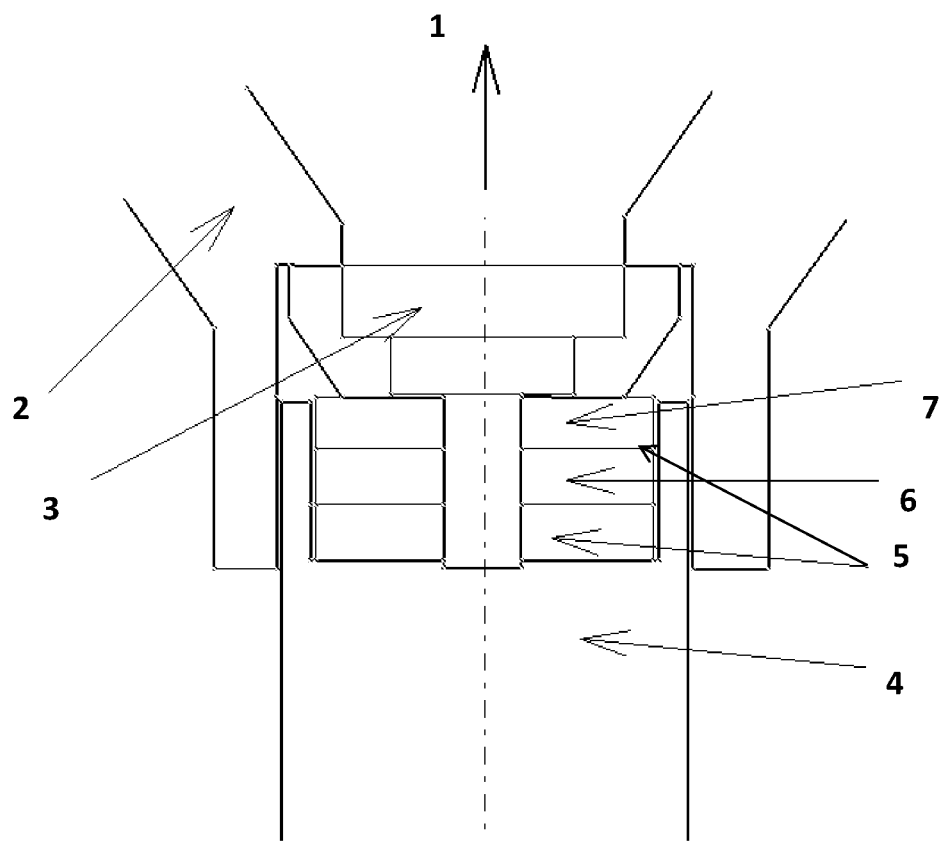
FIG. 4 shows a projectile comprising a piezoelectric crystal positioned in a fuze structure.

FIG. 4 shows a projectile 2 in flight in the direction indicated by arrow 1. The projectile 2 comprises a booster charge 3 and a fuze structure 4. In the fuze structure 4, a damping structure 5 (not to scale) composed of a silicone layer is joined to the piezoelectric crystal 6 (only the damping layer 5 below the crystal 6 is shown in FIG. 4—the damping layer 5 may in an alternative embodiment also entirely envelope the crystal 6). The piezoelectric crystal 6 is in contact with the projectile body via boundary surface 7 (and via the enveloping damping layer 5) from which projectile body the shock wave upon impact is transmitted to the piezoelectric crystal 6.

The invention claimed is:

1. A piezoelectric sensor arrangement for use in a projectile, said piezoelectric sensor arrangement comprising a piezoelectric sensor fully or partially enveloped by a damping layer adapted to
   attenuate at least some mechanical wave frequencies, wherein the piezoelectric senor is arranged to generate a voltage output signal indicative of a mechanical wave traveling through the body of the projectile upon impacting on an object,
   wherein the sensor arrangement is arranged to integrate the voltage output signal over time, wherein the sensor arrangement is arranged to compare said integrated value with a predetermined threshold, wherein integral values above said threshold are indicative of the projectile impacting objects that are hard targets, and
   wherein the damping layer attenuation of mechanical wave and the integration of the voltage output signal together are arranged to filter mechanical wave frequencies above a predetermined cutoff frequency, wherein mechanical wave frequencies above said cutoff frequency are indicative of the projectile impacting objects that are soft objects, and wherein said predetermined cutoff frequency is at most 800 Hz.

2. The piezoelectric sensor arrangement according to claim 1, wherein the damping layer is glued or soldered to the piezoelectric sensor.

3. The piezoelectric sensor arrangement according to claim 1, wherein the damping layer has a thickness ranging from 0.01 to 1 mm.

4. The piezoelectric sensor arrangement according to claim 1, wherein the damping layer is composed of silicone or a silicone-based material.

5. The piezoelectric sensor arrangement according to claim 1, wherein the piezoelectric sensor is a piezoelectric crystal.

6. Method of discriminating voltage outlet signals by means of the piezoelectric sensor arrangement according to claim 1 comprising
   i) integrating the voltage output signals obtained from the piezoelectric sensor upon impact over time to calculate the electrical energy
   ii) setting a threshold limit based on knowledge of the calculated electrical energies obtained in step i) thus safeguarding discrimination of low-energy content originating from undesired soft objects below said threshold limit from high-energy content originating from desired hard targets.

7. The piezoelectric sensor arrangement according to claim 1, wherein a use of a piezoelectric sensor arrangement in a projectile to safeguard that an unintentional detonation does not occur.

8. Projectile arranged with a piezoelectric sensor according to claim 1.

* * * * *